(12) United States Patent
Wang et al.

(10) Patent No.: US 8,289,061 B2
(45) Date of Patent: Oct. 16, 2012

(54) TECHNIQUE TO REDUCE CLOCK RECOVERY AMPLITUDE MODULATION IN HIGH-SPEED SERIAL TRANSCEIVER

(75) Inventors: Hui Wang, Shanghai (CN); Lixin Jiang, Shanghai (CN)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 12/569,730

(22) Filed: Sep. 29, 2009

(65) Prior Publication Data
US 2011/0074483 A1   Mar. 31, 2011

(51) Int. Cl.
*H03H 11/16* (2006.01)
*H03K 3/00* (2006.01)

(52) U.S. Cl. ......... 327/231; 327/250; 327/355; 327/361
(58) Field of Classification Search .................. 327/231, 327/233–235, 248, 250, 355, 361
See application file for complete search history.

(56) References Cited

U.S. PATENT DOCUMENTS

| | | | | |
|---|---|---|---|---|
| 4,977,580 A | * | 12/1990 | McNicol | 375/344 |
| 6,995,594 B2 | * | 2/2006 | Buchwald et al. | 327/248 |
| 7,271,969 B2 | * | 9/2007 | Carpenter et al. | 360/51 |
| 7,496,781 B2 | * | 2/2009 | Tamura et al. | 713/600 |
| 2003/0137765 A1 | * | 7/2003 | Yamazaki et al. | 360/39 |
| 2004/0088594 A1 | * | 5/2004 | Canagasaby et al. | 713/400 |
| 2005/0265504 A1 | * | 12/2005 | Robinson et al. | 375/375 |
| 2006/0227917 A1 | * | 10/2006 | Buchwald et al. | 375/355 |
| 2008/0080657 A1 | * | 4/2008 | Aziz et al. | 375/376 |
| 2010/0026367 A1 | * | 2/2010 | Jiang | 327/355 |
| 2010/0027607 A1 | * | 2/2010 | Kwasniewski et al. | 375/232 |

* cited by examiner

*Primary Examiner* — Ryan Jager
(74) *Attorney, Agent, or Firm* — Hayes & Boone LLP (57) ABSTRACT

A method is provided for improving clock recovery signal jitter in digital communication based on a phase adjustment technique in a phase interpolation. A clock signal is expressed as the combination of two sinusoidal signals. The phase interpolating process determines the amplitude of the first sinusoidal signal, and the amplitude of the second sinusoidal signal that is 90° out of phase from the first sinusoidal signal. The clock signal is then formed by combining first sinusoidal signal with the second sinusoidal signal by choosing the first and second amplitude such that the amplitude of the clock signal is substantially a constant. Modulation of the clock signal amplitude is significantly improved by the disclosed technique over the conventional technique when the sum of the first and second amplitudes of the two sinusoidal functions is kept a constant.

18 Claims, 7 Drawing Sheets

FIG. 7 ical Field

The present invention is generally related to the field of clock and data recovery in digital communication and, more specifically, to reduction of clock recovery amplitude modulation in high-speed serial data transceivers.

DISCUSSION OF RELATED ART

In many applications, including digital communications, clock and data recovery is performed before data can be decoded using a Clock-Data Recovery (CDR) circuit. In systems with relatively low signaling rates, the receiving chip can directly use an internally buffered version of the timing signal to extract the data from the data signal. This is the method that is used in SDRAM technology, for example. In systems with relatively high signaling rates, such as a high-speed serial transceiver system, the transceiver chip typically utilizes a clock alignment circuit, such as a Phase Locked Loop (PLL) or Delay Locked Loop (DLL) applying voltage controlled delay loops (VCDL) to create CDR circuits. Such circuits create an internal sampling clock signal, precisely aligned with the received timing signal, to extract data from the data signal. This method is typically used in RDRAM and DDR technologies. The data and timing lines are also well synchronized to eliminate timing jitter between them, which reduces a system's timing margin.

As data rates continue to increase, it is becoming increasingly difficult to match the data and timing signal lines to eliminate timing jitter. Furthermore, requiring a separate timing signal line to be routed along with the data lines is costly in terms of hardware area and power. An attractive option is to remove the timing line and instead use a circuit on the receiver or transceiver chip that recovers a timing signal from the data signal itself.

Therefore, system designers or integrators of modern high-speed serial transceivers have widely adopted the use of phase interpolation in CDR, which is capable of extracting a clock signal encoded within a received raw data stream and enable network synchronization over a single data channel. Higher bandwidth performance, better reliability, and lower power cost have made the Phase Interpolator based CDR widely used.

There is a need for a phase interpolating technique in CDR with minimum amplitude modulation in the clock recovery signals.

SUMMARY

Consistent with embodiments of the present invention, methods of generating a clock signal are provided. In some embodiments, a method comprises determining a first amplitude for a first sinusoidal signal; determining a second amplitude for a second sinusoidal signal that is 90° out of phase from the first sinusoidal signal; and forming the clock signal by combining the first sinusoidal signal with the second sinusoidal signal; wherein the first and second amplitude is chosen such that the amplitude of the clock signal is substantially a constant.

BRIEF DESCRIPTION OF THE DRAWINGS

Embodiments of the present invention will be described more fully below with reference to the accompanying drawings. This invention may, however, be embodied in many different forms and should not be construed as being limited to the embodiments set forth herein.

DETAILED DESCRIPTION

In the following description, specific details are set forth describing the embodiments disclosed herein. It will be apparent, however, to one skilled in the art that some embodiments may be practiced without some or all of these specific details. The specific embodiments disclosed herein are meant to be illustrative but not limiting. One skilled in the art may realize other material that, although not specifically described therein, is within the scope and the spirit of this disclosure.

Generally, in a phase interpolator circuit of a digital clock recovery system, a reference clock signal of a given frequency is generated together with a number of different clock signals having the same frequency but with different phases. One of the benefits of phase interpolator based CDRs is that the data sampling point can be precisely adjusted by a digitally controlled offset. This allows the cancellation of offsets from device mismatches and other causes, and enables in-system measurements of the timing margin available for reliably extracting data from the data signal.

Figure 1:
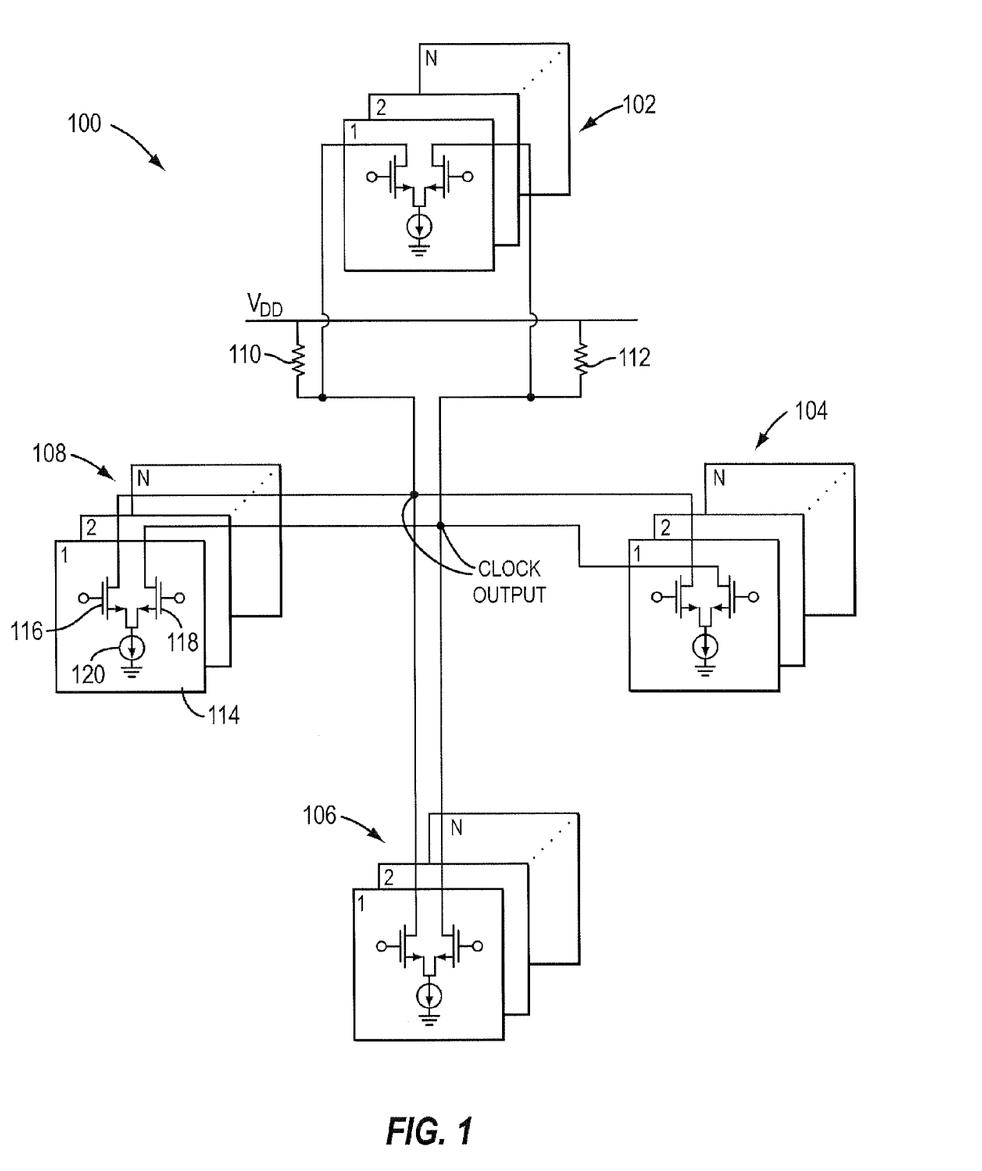
FIG. 1 shows a diagram illustrating a four stage phase interpolator.

A phase interpolator circuit is illustrated in FIG. 1. As shown in FIG. 1, a phase interpolator circuit 100 includes four reference stages 102, 104, 106, and 108, which are coupled together and to a power supply voltage $V_{DD}$ via resistors 110 and 112. Each reference stage 102, 104, 106 and 108 receives a reference signal, which corresponds to a clock signal having its phase offset by multiples of 90°. First reference stage 102 receives the clock signal having 0° phase offset, a second reference stage 104 receives the clock signal having its phase offset by 90°, a third reference stage 106 receives the clock signal having its phase offset by 180°, and a forth reference stage 108 receives the clock signal having its phase offset by 270°. The four reference stages then output a scaled clock signal which, when combined, provides a recovery clock signal that can have any desired phase. The four scaled clock signal outputs from reference stages are a sin ωt, b cos ωt, −c sin ωt, and −d cos ωt, wherein a, b, c and d are the scaling coefficients respectfully generated by the four reference stages.

Although only specifically illustrated and labeled in reference stage 108, each reference stage 102, 104, 106 and 108 includes N identical number of current source circuits 114. Each current source circuit 114 includes a differential pair of transistors 116 and 118 coupled to a current source 120. Such an arrangement is also referred to as a tail current source. The differential pair of transistors includes matching transistors with their source tied together and to the tail current source. In operation, current sources are turned on by applying the clock signal across the gate such that the scaling coefficients a, b, c and d are determined by the number of current sources 120 actually turned on among the N sources. The summed current can then be normalized by dividing by N. If the tail current of a differential pair is on, the signal of that certain phase is added to the output signal with a weighting of 1/N. Every turned-on current source contributes to a unit scaling amplitude or a phase step. Depending on how many current sources 120 are turned on, the recovered clock signal is interpolated by the scaled clock signal output from reference stages 102, 104, 106, and 108.

The output clock signal $CK_{out}$ from the phase interpolator is the sum of the four output clock signals from the four reference stages.

$$CK_{out}=a \sin \omega t+b \cos \omega t-c \sin \omega t-d \cos \omega t \quad \text{(Equation 1)}$$

For simplicity, coefficients A and B are introduced to reduce the four terms in Equation 1 to two terms in Equation 2.

$$CK_{out}=A \sin \omega t+B \cos \omega t=\sqrt{A^2+B^2} \sin(\omega t+\theta), \quad \text{(Equation 2)}$$

where
$\theta=\tan^{-1}(B/A)$,
$A=a-c$, and
$B=b-d$.

In Equation 2, the phase of output clock signal $CK_{out}$ is interpolated by adjusting the different weight scaling coefficients A and B of the two input clock signals sin ωt and cos ωt. The coefficients are determined by setting the total tail current amount for each phase. If the tail current of a differential pair is on, the signal of that certain phase is added to the output with a weighting of 1/N. Depending on how many differential pairs are turned on, the output signal is interpolated by the different weighting of the multi-phase clock input. The total number of unit current sources in the "ON" state for all four clock phases at any time can have a constant value, which results in a clock signal that has modulated amplitude in the case when A+B is a constant. In Equation 2, the interpolator output clock signal amplitude can be expressed as $\sqrt{A^2+B^2}$.

Figure 2:
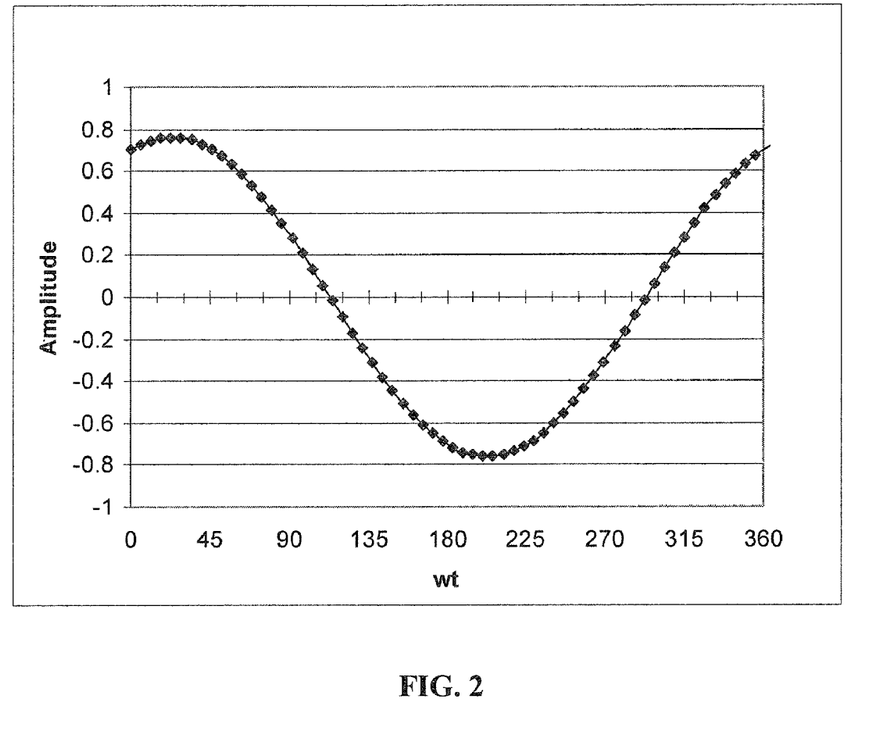
FIG. 2 illustrates a clock signal composed of two sinusoidal functions: A sin ωt+B cos ωt.

FIG. 2 illustrates clock signal as the sum of two sinusoidal functions of time expressed by Equation 2: CKout=A sin ωt+B cos ωt, where A+B is normalized to one and have particular values A=0.3 and B=0.7. The interpolated clock signal amplitude is given by $\sqrt{A^2+B^2}$, as shown in Equation 2. As can be seen from FIG. 2, there is a significant variation in amplitude.

Figure 3:
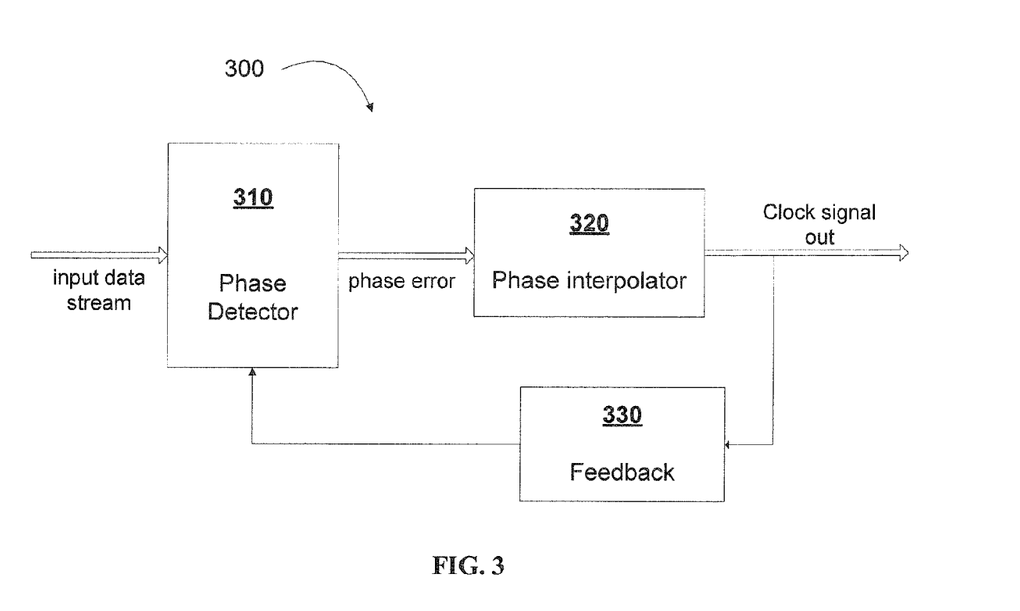
FIG. 3 illustrates a schematic block diagram of a clock and data recovery system using a phase interpolator.

FIG. 3 illustrates a schematic block diagram of a clock and data recovery system 300 using a phase interpolator 330 such as that shown in FIG. 1. In a clock and data recovery circuit, an input clock signal is often edge aligned with the data edge transitions of a digital data stream and is then coupled into a phase detector 310. Phase detector 310 detects whether the clock signal leads or lags the sampled data signal and generates a phase difference signal corresponding to the detected phase difference between the data edge clock signal and sampled data signal. In some embodiments, phase detector 310 may compare sampled data edge clock signal values with previously received sampled data signal values to determine a lead/lag phase relationship between the data edge clock signal and the sampled data signal. A phase error signal may be generated based on the determined lead/lag phase relationship. For example, if the data edge clock signal leads the sampled data signal, a phase difference signal may be generated that indicates the data edge clock signal leading the sampled data signal. Similarly, if the data edge clock signal lags the sampled data signal, a phase difference signal may be generated that indicates the data edge clock signal lagging the sampled data signal. If there is no detected lead/lag relationship, a signal indicating that the data edge clock signal and the sampled data signal are phase aligned may be generated. The phase difference signal generated by phase detector 310 is subsequently passed into the phase interpolator 320. Feedback circuit 330 sends the phase adjusted clock signal back to the phase detector for better phase correction.

Figure 4:
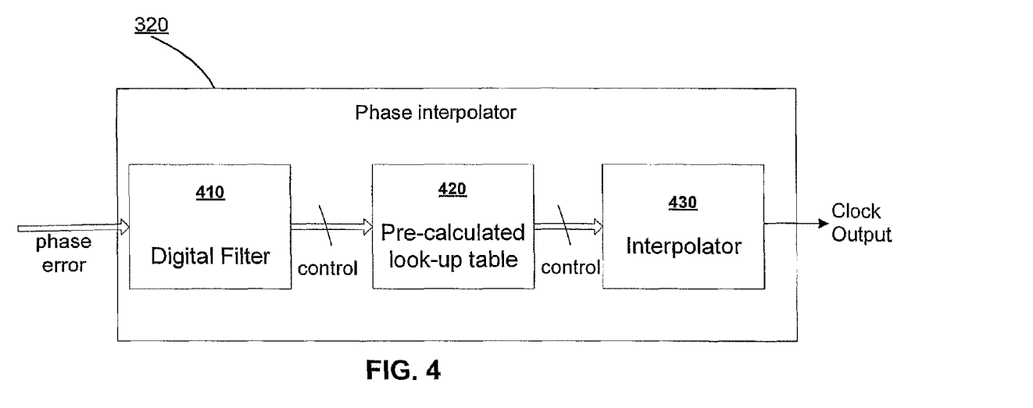
FIG. 4 illustrates a block diagram of a phase interpolator including a pre-calculated look-up table, consistent with some embodiments of the present invention.

FIG. 4 is a block diagram showing phase interpolator 320 consistent with some embodiments of the present invention. In interpolator 330, instead of keeping (A+B) a constant, ($A^2+B^2$) is kept constant. As shown in FIG. 4, the phase error, which is the phase difference between the data edge clock signal and the sampled data signal detected by the phase detector 310 in FIG. 3, enters the phase interpolator 320. The phase error first passes a digital filter 410 and is then processed through a look-up table 420 before becoming a control input to the interpolator 430 for the controlling tail current sources 120 in FIG. 1. The look-up table 420 stores the pre-calculated values of the clock signal amplitude (A and B) in a computer readable media.

During a phase interpolation implementation when (A+B) is kept a constant, adjusting A and B to achieve a matching phase angle θ leads to undesired large modulations of the clock signal amplitude $\sqrt{A^2+B^2}$. The amplitude modulation causes large errors in high-speed flip-flops or other circuits in the high-speed serial transceivers as explained in the following text.

Figure 5:
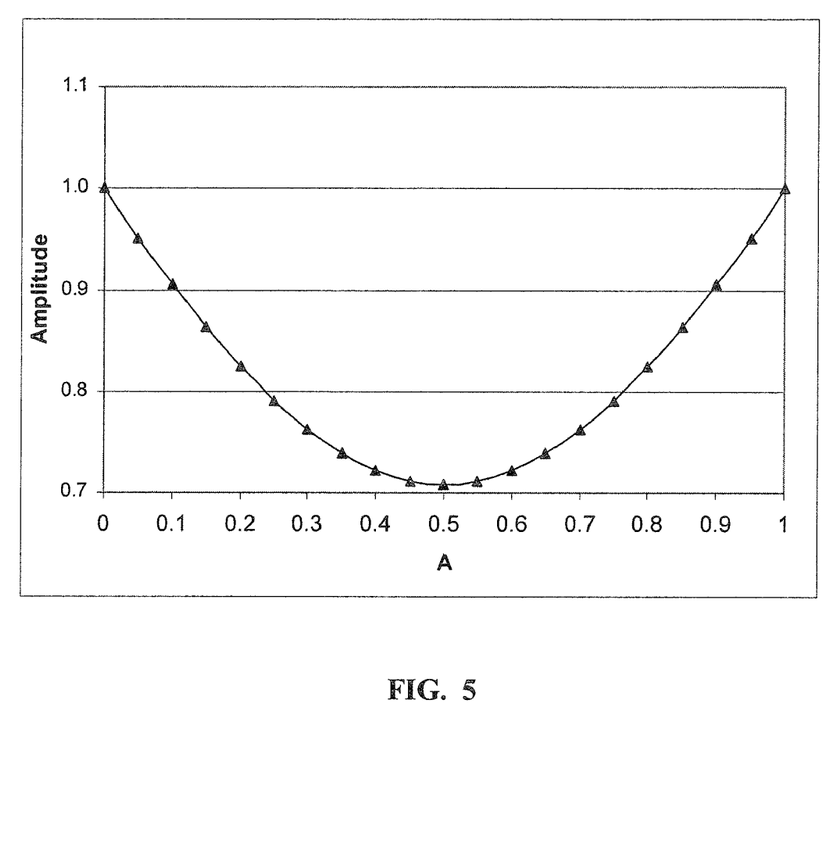
FIG. 5 illustrates the amplitude modulation range of a clock recovery signal if A+B is a constant.

FIG. 5 shows the modulation in clock signal amplitude $\sqrt{A^2+B^2}$ as a function of the value of A for a digital phase interpolator under the condition of A+B=Constant. FIG. 5 shows that the amplitude of the phase adjusted clock recovery signal has a minimum value of 0.7, about 30% lower than the maximum signal amplitude of 1. The standard deviation of the amplitude modulation is 0.091 for a 5-bit phase interpolator having a scaling phase step of 32. This level of modulation carries the risk of large clock recovery signal jitter and other errors in high-speed serial transceivers.

Some embodiments of the current invention apply the condition $A^2+B^2$=Constant and use a pre-calculated look-up table to adjust the phase of phase interpolator 320. A phase adjustment look-up table that can be utilized is shown as Table 1 below, and the values of A and B are stored. The first column of Table 1 lists the amplitude A of the first sinusoidal function of a clock signal, scaled to integer numbers from 0, 1, 2, 3 ... to $2^N-1$, where N is the preferred bit number of the digital processor in the clock recovery system. For example, in a 5-bit system, A ranges from 0 to 31. The second column lists amplitude B, which is acquired by quantizing the values of $\sqrt{2^{2N}-A^2}$. The third column lists what would be the calculated amplitude of the resultant clock signal $\sqrt{A^2+B^2}$ by the computer.

TABLE 1

Phase adjustment look-up table in the phase interpolator scaled to 32 by keeping $A^2 + B^2$ = Constant

| A × 32 | B × 32 | Resultant Amplitude |
|---|---|---|
| 0 | 32 | 32.00 |
| 1 | 31 | 31.98 |

TABLE 1-continued

Phase adjustment look-up table in the phase interpolator scaled to 32 by keeping $A^2 + B^2$ = Constant

| A × 32 | B × 32 | Resultant Amplitude |
|---|---|---|
| 3 | 31 | 31.99 |
| 4 | 31 | 31.91 |
| 6 | 31 | 31.95 |
| 7 | 31 | 31.82 |
| 9 | 30 | 31.92 |
| 10 | 30 | 31.75 |
| 12 | 29 | 31.91 |
| 13 | 28 | 31.71 |
| 15 | 28 | 31.96 |
| 16 | 27 | 31.77 |
| 17 | 26 | 31.57 |
| 19 | 25 | 31.96 |
| 20 | 24 | 31.81 |
| 21 | 23 | 31.67 |
| 22 | 22 | 31.56 |
| 23 | 21 | 31.48 |
| 24 | 20 | 31.43 |
| 25 | 19 | 31.44 |
| 26 | 17 | 31.50 |
| 27 | 16 | 31.62 |
| 28 | 15 | 31.80 |
| 28 | 13 | 31.16 |
| 29 | 12 | 31.48 |
| 30 | 10 | 31.88 |
| 30 | 9 | 31.40 |
| 31 | 7 | 31.96 |
| 31 | 6 | 31.62 |
| 31 | 4 | 31.35 |
| 31 | 3 | 31.16 |
| 31 | 1 | 31.04 |

Figure 6:
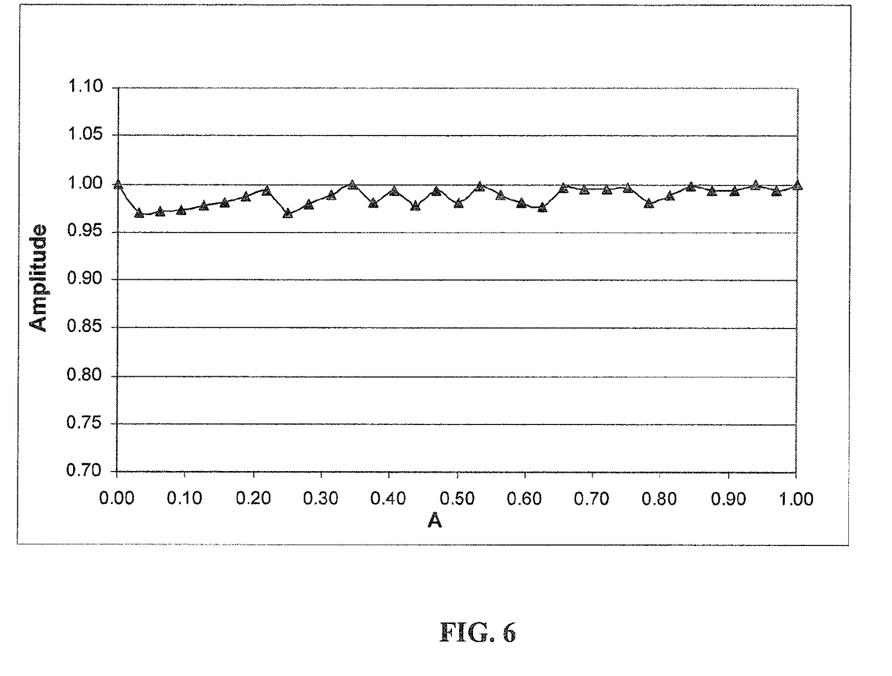
FIG. 6 illustrates the amplitude modulation range of a clock recovery signal if $A^2+B^2$ is a constant, consistent with some embodiments of the present invention.

FIG. 6. illustrates the modulation in the clock signal amplitude $\sqrt{A^2+B^2}$, normalized to 1.0, for values of A processed by the disclosed digital phase interpolator after applying the phase adjustment look-up table. The clock signal amplitude has a minimum value of 0.97. By using the pre-calculated look-up table, the clock signal amplitude variation is significantly reduced and its standard deviation (or one sigma) drops to 0.008 from 0.09 in the case of keeping A+B as a constant. The disclosed phase adjustment technique brings a factor of 10 improvement in standard deviation in amplitude modulation of the clock recovery signal, leading to many fewer errors in clock timing.

Figure 7:
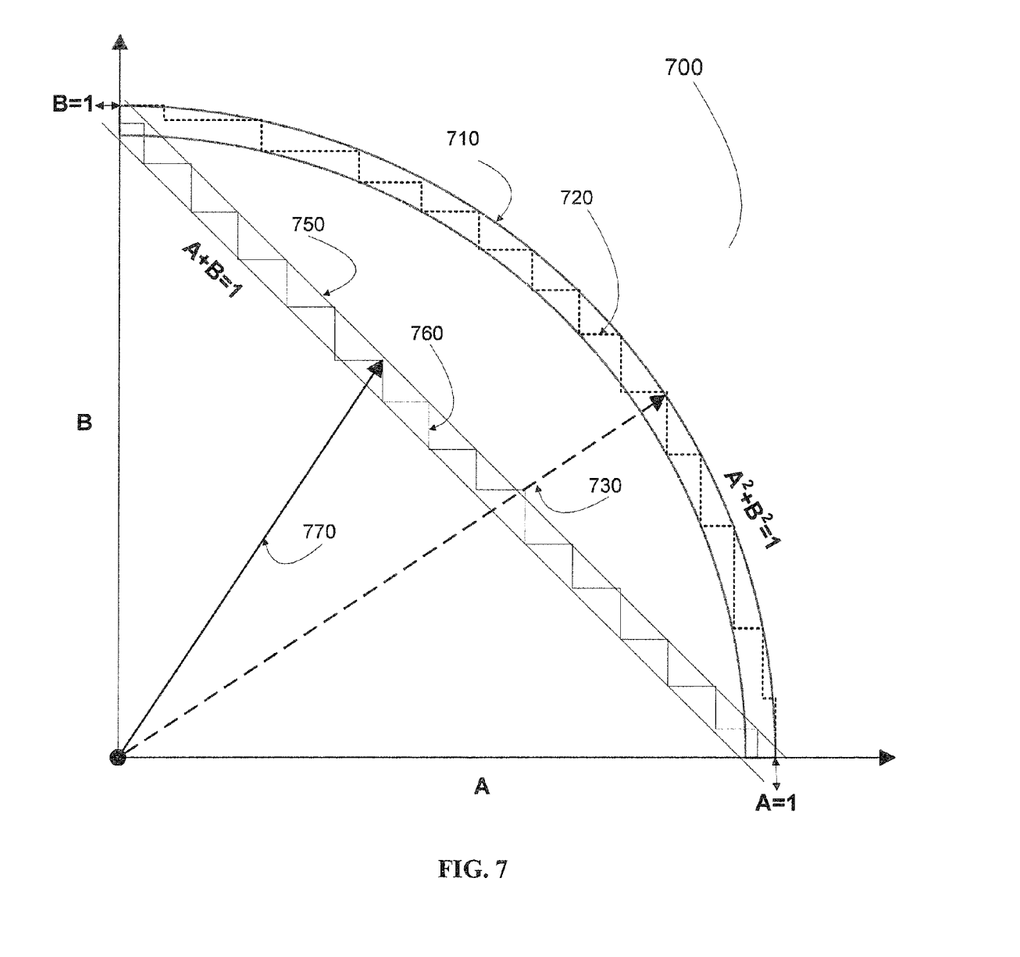
FIG. 7 shows a comparison between amplitude modulations of clock recovery signals where the sum of the amplitudes is held constant and where the sum of the amplitudes squared is a constant.

FIG. 7 shows a diagram demonstrating how the pre-calculated Table 1 is formulated. Axis A and axis B provide values for the clock signal of Equation 2. Curve 710 defines $A^2+B^2=1$ where A and B are both positive numbers. Vector 730 stays within the curve 710, and is constrained by line 720, which is formed from quantized phase steps in A and B. In a 5-bit system, A and B are normalized to 1 by dividing A and B with 32. Thus, the amplitude of vector 730 varies with 720 in the vicinity of the curve 710.

At the same time, FIG. 7 compares the disclosed amplitude modulation in the clock recovery signal to the other technique where the clock signal vector 770 varies by staying inside of the condition A+B=1, represented by the straight line 750, and vector 770 amplitude is limited by the line 760 defined by the quantized values of A and B. Vector 770 varies from 0.7 to 1.0, whereas vector 730 varies from 0.97 to 1.0. Vector 730 is over 10 times more stable.

Table 1 is one example of some of the embodiments in the current invention. In some the values of B are calculated instead from the values of A by a computer in real time.

Another embodiment can involve a clock signal as formulated in Equation 1 with four phase weighting amplitudes a, b, c and d. A look-up table which stores the values of the four amplitudes of a, b, c and d can be pre-calculated and stored in computer readable media. A resultant clock signal is then calculated under the condition that the clock signal amplitude is a constant.

Some other embodiments may include look-up tables in which units of A and B are different, for example, A and B are not normalized to 1.

The foregoing description is intended to illustrate, but not to limit, the scope of the invention, which is defined by the scope of the appended claims. Other embodiments are within the scope of the this disclosure.

What is claimed is:

1. A method of generating a clock signal, comprising,
determining a first amplitude for a first sinusoidal signal;
determining a second amplitude for a second sinusoidal signal that is 90° out of phase from the first sinusoidal signal; and
forming the clock signal by combining the first sinusoidal signal with the second sinusoidal signal;
wherein the first and second amplitudes are quantized values chosen such that an amplitude of a combination of the first sinusoidal signal and the second sinusoidal signal is substantially constant as the first amplitude changes.

2. A method of claim 1, wherein the method is operated by a computer.

3. A method of claim 1, the amplitudes of the first sinusoidal signal and second sinusoidal signal are stored as a look up table in a non-transitory computer readable media.

4. A method of claim 1, further comprising:
providing a phase interpolator having a plurality of reference stage circuits each having a plurality of current source circuits, and using the first and second amplitudes to control the current source circuits, the current source circuits having a predetermined phase offset relative to one another, and coupled via drains of transistors.

5. The method of claim 4, further comprising:
providing an input terminal to the current sources to receive an input control signal.

6. The method of claim 5, further comprising:
providing a N-bit digital filter using a look-up table to provide a control input to the input terminal of the current sources.

7. A method of claim 1, the amplitudes of the first sinusoidal signal and second sinusoidal signal are listed in a look-up table, wherein the look-up table is stored in a non-transitory computer readable media.

8. A method of adjusting a phase interpolator comprising:
determining a first amplitude for a first sinusoidal signal;
determining a second amplitude for a second sinusoidal signal that is 90° out of phase from the first sinusoidal signal; and
forming a clock signal by combining the first sinusoidal signal with the second sinusoidal signal;
wherein the first and second amplitudes are chosen from a lookup table
stored in a non-transitory computer readable media;
further wherein forming the lookup table comprises:
listing a set of quantized values for the first amplitude;
calculating values of an intermediate amplitude from the first amplitude and a first constant; and
assigning a quantized value to the second amplitude from the intermediate amplitude.

9. The method of claim 8, further comprising:
scaling the amplitude values in the lookup table.

10. The method of claim 8 wherein forming the lookup table further comprises listing a third amplitude using the quantized values of the first amplitude and the quantized values of the second amplitude.

11. The method of claim 10 wherein listing the third amplitude comprises calculating a square root of a sum of the first quantized values squared, and the quantized values of the second amplitude, squared.

12. A method of adjusting a phase interpolator comprising:
determining a first amplitude for a first sinusoidal signal;
determining a second amplitude for a second sinusoidal signal that is 90° out of phase from the first sinusoidal signal; and
forming a clock recovery signal by combining the first sinusoidal signal with the second sinusoidal signal;
wherein the first and second amplitudes are quantized values chosen such that the amplitude of the clock recovery signal is substantially constant as the first amplitude changes, the amplitudes of the first sinusoidal signal and second sinusoidal signal are listed in a look-up table, and the look-up table is stored in a non-transitory computer readable media.

13. A method of adjusting a phase interpolator comprising:
determining a first amplitude for a first sinusoidal signal;
determining a second amplitude for a second sinusoidal signal that is 90° out of phase from the first sinusoidal signal; and
forming a clock recovery signal by combining the first sinusoidal signal with the second sinusoidal signal;
wherein the first and second amplitudes are chosen such that the amplitude of the clock recovery signal is substantially a first constant, the amplitudes of the first sinusoidal signal and second sinusoidal signal are listed in a look-up table, and the look-up table is stored in a non-transitory computer readable media; wherein
the amplitude of the clock recovery signal is obtained by calculating the square root of a sum of the first amplitude's square and the second amplitude's square; and
assigning the square root value to the amplitude of the clock recovery signal.

14. The method of claim 13 wherein the phase of the clock recovery signal is obtained from the ratio of the second amplitude to the first amplitude.

15. A method of adjusting a phase interpolator comprising:
determining a first amplitude for a first sinusoidal signal;
determining a second amplitude for a second sinusoidal signal that is 90° out of phase from the first sinusoidal signal; and
forming a clock recovery signal by combining the first sinusoidal signal with the second sinusoidal signal;
wherein the first and second amplitudes are quantized values chosen from a look-up table, and the look-up table is stored in a non-transitory computer readable media; wherein
the lookup table is formed by:
listing a set of values for the first amplitude in the look-up table;
calculating values of an intermediate amplitude from the first amplitude and the first constant;
quantizing the values of the intermediate amplitude;
assigning the quantized values to the second amplitude in the look-up table.

16. The method of claim 15 wherein the set of values for the first amplitude is a list of $2^N$ integers greater than 0 and smaller than $2^N$, where N is the preferred bit number of a digital processor coupled to the phase interpolator.

17. The method of claim 15 wherein quantizing the values of the intermediate amplitude comprises finding an integer number such that the square root of the sum of the first amplitude squared and the second amplitude squared is a number greater than $2^N-1$ and no greater than $2^N$.

18. The method of claim 17 wherein every pair of first amplitude and second amplitude in the lookup table is different

* * * * *